(12) United States Patent
Romanovskyy (10) Patent No.: US 8,995,219 B2
(45) Date of Patent: Mar. 31, 2015

(54) WORD LINE DRIVER

(75) Inventor: Sergiy Romanovskyy, Ottawa (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 362 days.

(21) Appl. No.: 13/433,075

(22) Filed: Mar. 28, 2012

(65) Prior Publication Data

US 2013/0258797 A1    Oct. 3, 2013

(51) Int. Cl.
*G11C 8/08* (2006.01)

(52) U.S. Cl.
CPC .......................................... *G11C 8/08* (2013.01)
USPC ............ 365/230.06; 365/185.23; 365/189.11; 365/149

(58) Field of Classification Search
USPC .................... 365/230.06, 185.23, 189.11, 149
See application file for complete search history.

(56) References Cited

U.S. PATENT DOCUMENTS

| | | | | |
|---|---|---|---|---|
| 5,412,331 A | * | 5/1995 | Jun et al. | 326/105 |
| 5,844,853 A | * | 12/1998 | Kitsukawa et al. | 365/226 |
| 6,373,753 B1 | * | 4/2002 | Proebsting | 365/189.09 |
| 6,545,923 B2 | * | 4/2003 | Sim et al. | 365/204 |
| 6,584,031 B2 | * | 6/2003 | Fujisawa et al. | 365/226 |
| 2003/0137889 A1 | * | 7/2003 | Lee | 365/204 |
| 2006/0176758 A1 | * | 8/2006 | Chun | 365/230.06 |
| 2006/0203600 A1 | * | 9/2006 | Chou et al. | 365/230.06 |
| 2006/0291321 A1 | * | 12/2006 | Leung | 365/230.06 |
| 2007/0008807 A1 | * | 1/2007 | Jeong | 365/230.06 |

OTHER PUBLICATIONS

Singh, Prashant et al., Special Section Briefs, "Self-Time Regenerators for High-Speed and Low-Power On-Chip Global Interconnect", IEEE Transactions on Very Large Scale Integration (VLSI) Systems, vol. 16, No. 6, Jun. 2008, pp. 673-677.

* cited by examiner

*Primary Examiner* — J. H. Hur
(74) *Attorney, Agent, or Firm* — Lowe Hauptman & Ham, LLP (57) ABSTRACT

A first circuit is coupled to a second circuit, which is coupled to a third circuit. A high voltage value of a first input signal and of a first output signal of the first circuit are equal, and are less than a high voltage value of a second output signal of the second circuit. A low voltage value of the first input signal is higher than a low voltage value of the first output signal. A high voltage value of the second output signal and of a third output signal of the third circuit are equal. The low voltage value of the first output signal, the second output signal, and the third output signal are equal.

20 Claims, 5 Drawing Sheets

WORD LINE DRIVER

FIELD

The present disclosure is related to a word line driver.

BACKGROUND

A first transistor is called stronger than a second transistor when the driving capability of the first transistor is larger than that of the second transistor. Explained in a different way, the saturation current of the first transistor is higher than that of the second transistor when the voltage potentials on ports of both transistors are the same.

In one approach, an inverter is used at the output stage of a word line driver. The inverter includes a PMOS transistor and an NMOS transistor. The output of the inverter provides a signal for the word line. Based on the operation of the word line driver, when the word line is activated, the voltage at the gate of the NMOS transistor is higher than the voltage at the source of the NMOS transistor. As a result, the NMOS transistor is not fully off, and generates leakage current. The PMOS transistor is designed to be stronger than the NMOS transistor to compensate for the leakage current from the NMOS transistor. As a result, the range for the voltage at the source of the NMOS transistor is limited by the threshold voltage of the NMOS transistor. Further, die sizes for the PMOS transistor and thus for the output stage of the word line driver are large.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have at least one of the following features and/or advantages. A chain of inverters is used to shift the voltage level of the input signal. Die areas for the inverters are small. Inverters are simple to design, eliminating the need to use complex voltage level shifters. An input of the inverter in the output circuit is configured to receive voltage VBB that matches voltage VBB at the source of the NMOS transistor of the inverter of the output circuit. As a result, the size of the PMOS transistor used in the output circuit is relatively small.

Word Line Driver Circuit

Figure 1:
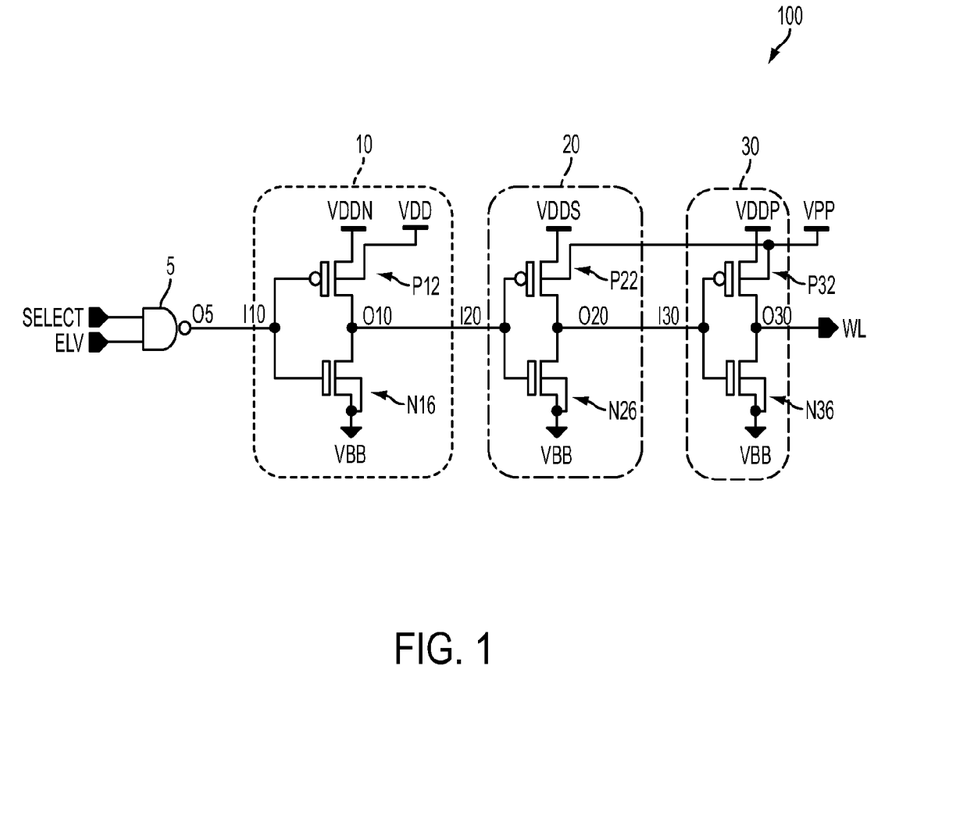
FIG. 1 is a diagram of a word line driver circuit, in accordance with some embodiments.

FIG. 1 is a diagram of a word line driver circuit 100 including circuits 5, 10, 20 and 30, in accordance with some embodiments. For simplicity, a reference name is used for both a node and a signal thereon. For example, the term SELECT is referred to both an input node of NAND 5 and the signal thereon. VDDN is used to refer to both an operational voltage node of transistor P12 and the voltage value on the node. WL is used to refer to a word line and the signal on the word line, etc.

For illustration, voltages VGSP12, VGSN16, VGSP22, VGSN26, VGSP32, and VGSN36 represent the voltage drop between the gate and the source of corresponding transistors P12, N16, P22, N26, P32, and N36. To avoid obscuring the drawing, voltages VGSP12, VGSN16, VGSP22, VGSN26, VGSP32, and VGSN36 are not shown.

In some embodiments, operational voltage VDD for transistors in circuit 100 is about 0.9 V. Reference voltage VSS is 0V or ground. Voltage VPP is about 1.5 V, and voltage VBB is about −0.5 V. Voltages VPP and VBB are the high and the low voltage levels for word line WL, respectively. The threshold voltage for each of PMOS transistor P12, P22, and P32 is −0.5 V, and the threshold voltage for each of NMOS transistor N16, N26, and N36 is 0.5 V.

In some embodiments, a memory array has a plurality of word lines WL, each of which is coupled to memory cells in a row. For illustration, one word line WL is shown. Signal SELECT at one input of NAND gate 5 is from a word line decoder (not shown). When signal SELECT is logically high, a word line WL corresponding to a row of memory cells is selected. Signal ELV at another input of NAND gate 5 is a logic timing signal that enables activation of the selected word line WL. For example, when both signals SELECT and ELV are logically high, signal O5 is logically low. Signal O10 is logically high. Signal O20 is logically low. As a result, word line WL is logically high. In other words, word line WL is activated.

Output node O5 of NAND gate 5 is coupled to input node I10 of circuit 10. Output node O10 of circuit 10 is coupled to input node I20 of circuit 20. Output node O20 of circuit 20 is coupled to input node I30 of circuit 30. Output node O30 of circuit 30 is coupled to word line WL.

Circuits 10, 20, and 30 are each configured and function as an inverter. For example, when signal O5 coupled to signal I10 is logically low, signal O10 coupled to signal I20 is logically high; signal O20 coupled to signal I30 is logical low; and signal O30 coupled to word line WL is logically high. In contrast, when signal O5 or signal I10 is logically high, signal O10 is logically low; signal O20 is logical high; and signal O30 or word line WL is logically low. Based on the operation of circuits 10, 20, and 30, when signal O5 is logically low, word line WL is logically high and is called being on or activated. But when signal O5 is logically high, word line WL is logically low and is called being off or deactivated.

Supply voltage nodes VDDN, VDDS, and VDDP are coupled to the sources of corresponding PMOS transistors P12, P22, and P32. In a standby mode, nodes VDDN and VDDP each receive a voltage value lower than operational voltage value VDD. Explained in a different way, nodes VDDN and VDDP each receive a reduced voltage. Node VDDS receives operational voltage value VDD. As a result, the standby current in circuit 100 is reduced. For example, in the standby mode, node I10, node I20, node 130, and word line WL are at voltage values VDD, VBB, VDD, and VBB, respectively. As a result, circuits 10, 20 and 30 do not have direct current (DC) current, but only leakage current that is reduced.

During normal operation or the mission mode of circuit 100, node VDDN receives operational voltage VDD while nodes VDDS and VDDP receive voltage VPP. Unless otherwise stated, the below illustration is explained when circuit 100 operates in the normal operation mode.

Transistors P12, N16, P22, N26, P32, and P36 each have a thick gate oxide, and each have an operational voltage significantly higher than the operational voltage of core transistors, which each have a thin gate oxide. In some embodiments, the voltage drop between the gate and the source and between the gate and the drain of transistors P12, N16, P22, N26, P32, and P36 is as high as 2.0 V. In contrast, the voltage drop between the gate and the source and between the gate and the drain of core transistors do not exceed 1 V.

Circuit 10

The source of PMOS transistor P12 is configured to receive voltage VDDN, which is voltage VDD in the normal operation mode. The bulk of PMOS transistor P12 is configured to receive voltage VDD. PMOS transistor P12 is called the P-side of circuit 10 while NMOS transistor N16 is called the N-side.

Circuit 10 functions as an inverter and a voltage level shifter. With respect to the inverter function, node I10 is at the gates of PMOS transistor P12 and NMOS transistor N16. When node I10 is logically high, or at voltage VDD of 0.9V, PMOS transistor P12 is off, and NMOS transistor N16 is on. As a result, output node O10 of circuit 10 is pulled to voltage VBB at the source of NMOS transistor N16. In other words, signal O10 is the result of a high logical value at input node I10 being inverted to a low logical value at the output node O10.

In contrast, when node I10 is logically low, such as at voltage VSS, ground, or 0 V, the gate of PMOS transistor P12 is also at 0 V. The source of PMOS transistor P12 is at voltage VDD. As a result, voltage VGSP12 is 0V–VDD or –0.9 V and PMOS transistor P12 is therefore on. When NMOS transistor N16 is completely off, node O10 is pulled to voltage VDD at the source of PMOS transistor P12. Node I10 is also the gate of NMOS transistor N16, which is at 0 V. The source of NMOS transistor N16 is at voltage VBB. As a result, voltage VGSN16 is 0–VBB, or 0 V–(–0.5 V) or 0.5 V in some embodiments. Further, in some embodiments, the threshold voltage of NMOS transistor N16 is about 0.5 V. Consequently, in some conditions, NMOS transistor N16 is not completely off. Transistor N16 is called conducting weakly, or partly turned on. In some embodiments, PMOS transistor P12 is designed to have a stronger driving capability to compensate for the fact that NMOS transistor N16 is not completely off. Explained in a different way, the P-side is designed to be stronger than the N-side. For example, in some embodiments, the size of PMOS transistor P12 is designed to be several times bigger than that of NMOS transistor N16. In some embodiments, the sizes of transistors P12 and N16 are selected to maximize the high voltage level of output node O10. For example, the sizes of transistors P12 and N16 are selected such that output node O10 is pulled to a predetermined voltage value closer to operational voltage VDD at the source of PMOS transistor P12. As a result, signal O10 is the result of a low logical value of voltage VSS at input node I10 being inverted to a high logical value of voltage VDD at the output node O10.

With respect to the voltage level shifting function of circuit 10, signals SELECT and ELV swing between operational voltage VDD and ground or reference voltage VSS. As a result, signal O5 and thus signal I10 also swing between voltages VDD and VSS. Signal O10, however, swings between voltages VDD and VBB. For example, when PMOS transistor P12 is on, and NMOS transistor N16 is almost off, signal O10 is pulled to voltage VDD at the source of PMOS transistor P12. In other words, the high logical value of signal O10 is voltage VDD. In contrast, when PMOS transistor P12 is off, and NMOS transistor 16 is on, signal O10 is pulled to voltage VBB. In other words, the low logical value of signal O10 is voltage VBB. Explained in a different way, the low logical value of input signal I10 is shifted from voltage VSS to voltage VBB as the low logical value of output signal O10.

Circuit 20

The source of PMOS transistor P22 is configured to receive voltage VDDS, which is voltage VPP in the normal operation mode. The bulk of PMOS transistor P22 is configured to receive voltage VPP. PMOS transistor P22 is called the P-side of circuit 20 while NMOS transistor N26 is called the N-side.

Circuit 20 functions as an inverter and a voltage level shifter. With respect to the inverter function, node I20 is at the gates of PMOS transistor P22 and NMOS transistor N26. When node I20 is logically low, such as at voltage VBB level, PMOS transistor P22 is on, and NMOS transistor N26 is off. As a result, output node O20 of circuit 20 is pulled to voltage VPP at the source of PMOS transistor P22. In other words, signal O20 is the result of a voltage VBB level at input node I20 being inverted to a high voltage VPP level at the output node.

In contrast, when node I20 is logically high, such as at voltage VDD, the gate of NMOS transistor N26 is also at voltage VDD. At the same time, the source of NMOS transistor N26 is at voltage VBB. As a result, voltage VGSN26 dropped across the gate and the source of transistor N26 is voltage VDD–voltage VBB or 0.9 V–(–0.5 V) or 1.4 V in some embodiments. Transistor N26 is therefore on. When PMOS transistor P22 is completely off, node O20 is pulled to voltage VBB at the source of NMOS transistor N26. Node I20 is also the gate of PMOS transistor P22, which is at voltage VDD and the source of PMOS transistor P22 is at voltage VPP. As a result, voltage VGSP22 dropped across the gate and the source of transistor P22 is VDD–VPP or 0.9 V–1.5 V or –0.6V. In some embodiments, the threshold voltage of PMOS transistor P22 is –0.5 V. As a result, in some conditions, PMOS transistor P22 is not completely off. In such conditions, PMOS transistor P22 is called conducting weakly, or partly being turned on. In some embodiments, NMOS transistor N26 is designed to have a stronger driving capability to compensate for the fact that PMOS transistor P22 is not completely off. Explained in a different way, the N-side of circuit 20 is designed to be stronger than the P-side. For example, in some embodiments, the size of NMOS transistor N26 is designed to be several times bigger than that of PMOS transistor P22. In some embodiments, the sizes of transistors N26 and P22 are selected such that the voltage level of signal O20 is significantly less than the threshold voltage of transistor N36. In some embodiments, the sizes of transistors N26 and P22 are selected to maximize the low voltage level of node O20. For example, the sizes of transistors N26 and P22 are selected such that node O20 is pulled to a predetermined voltage value closer to voltage VBB at the source of NMOS transistor N26. As a result, signal O20 is the result of a high logical value at input node I20 being inverted to a low logical value at the output node O20.

With respect to the voltage level shifting function of circuit 20, signal O20 swings between voltages VBB and VPP. For example, when PMOS transistor P22 is almost off, and NMOS transistor N26 is on, signal O20 is pulled to voltage VBB at the source of NMOS transistor N26. In other words, the low logical value of signal O20 is voltage VBB. In contrast, when PMOS transistor P22 is on, and NMOS transistor N26 is off, signal O20 is pulled to voltage VPP at the source of PMOS transistor P22. In other words, the high logical value of signal O20 is voltage VPP. Explained in a different way, the high logical value of input signal I20 is shifted from voltage VDD to voltage VPP as the high logical value of output signal O20.

Circuit 30

Circuit 30 provides the high logical value of voltage VPP and the low logical value of voltage VBB to word line WL. As explained above, signal O20 or I30 swings between voltages VPP and VBB. When node I30 is at voltage VBB, the gate of NMOS transistor N36 is at voltage VBB. The source of NMOS transistor N36 is also at voltage VBB. As a result, voltage VGSN36 dropped across the gate and the source of transistor N36 is VBB−VBB or 0 V. Consequently, NMOS transistor N36 is completely off, and word line WL is electrically disconnected from the VBB source. Signal I30 is also at the gate of PMOS transistor P32, which is voltage VPP. The source of PMOS transistor P32 is at voltage VPP. As a result, voltage VGSP32 dropped across the gate and the source of PMOS transistor P32 is VPP−VPP or 0 V. As a result, transistor P32 is on. Word line WL is therefore pulled to voltage VPP at the source of PMOS transistor P32. In other words, the high logical value of word line WL is voltage VPP.

In contrast, when node I30 is at voltage VPP, the gate of PMOS transistor P32 is at voltage VPP. At the same time, the source of PMOS transistor P32 is also at voltage VPP. As a result, voltage VGSP32 dropped across the gate and the source of PMOS transistor P32 is VPP−VPP or 0 V. Consequently, transistor P32 is off, and word line WL is electrically disconnected from the VPP source. Node I30 is also the gate of NMOS transistor N36, which is at voltage VPP and the source of NMOS transistor N36 is at voltage VBB. As a result, voltage VGSN36 dropped across the gate and the source of transistor N36 is VPP−VBB or 1.5V−(−0.5V) or 2.0 V in some embodiments. As a result, NMOS transistor N36 is on. Word line WL is therefore pulled to voltage VBB at the source of NMOS transistor N36. In other words, the low logical value of word line WL is voltage VBB.

Circuit 10—Another Implementation

Figure 2:
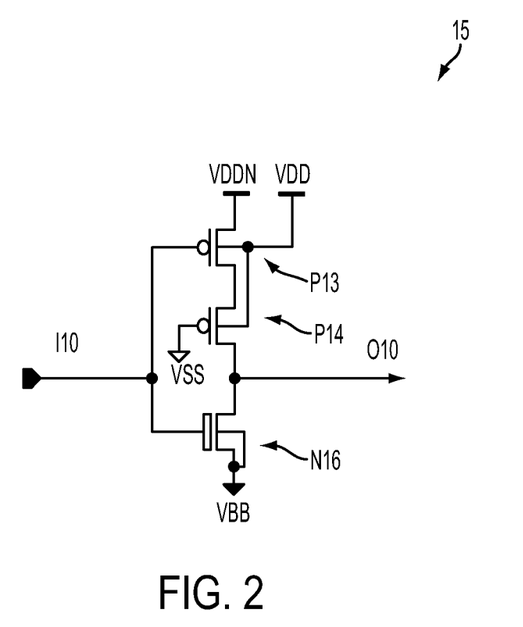
FIG. 2 is a diagram of another implementation of the inverter circuit 10 in FIG. 1, in accordance with some embodiments.

FIG. 2 is a diagram of a circuit 15 illustrating another implementation of circuit 10, in accordance with some embodiments.

Compared with circuit 10 in FIG. 1, PMOS transistors P13 and P14 in circuit 15 are used in place of PMOS transistor P12. PMOS transistors P13 and P14 each have a thin gate oxide, and are core transistors with an operational voltage VDD of 0.9V. The voltage drop between the gate and the source and between the gate and the drain of thin-oxide transistors P13 and P14 can be as high as 1.0V. The threshold voltage of each of PMOS transistors P13 and P14 is −0.3 V. PMOS transistors P13 and P14 are coupled in series. The source of PMOS transistor P13 is configured to receive voltage source VDDN. The drain of PMOS transistor P13 is coupled to the source of PMOS transistor P14. The gate of PMOS transistor P14 is configured to receive reference voltage VSS or ground. As a result, PMOS transistor P14 is on when circuit 15 is in operation.

Circuit 15 also functions as an inverter and a voltage level shifter similar to circuit 10. PMOS transistors P13 and P14 constitute the P-side or the pull-up side of circuit 15. Similar to circuit 10, in some embodiments, the P-side of circuit 15 is stronger than the N-side. Further, the driving capability of the P-side of circuit 15 depends on the size of transistors P13 and P14. In some embodiments, once the current relationship between the P-side and the N-side has been determined, the current for the P-side is known, and transistors P13 and P14 are sized to provide the desired output level by compensating the leakage current flowing through transistor N16, which is not fully turned off.

Transistor P14 is used to protect transistor P13. For example, without transistor P14, when node I10 is at VDD level, or 0.9V, and node O10 is at VBB level, or −0.5V, voltage VGDP13 dropped across the gate and the drain of transistor P13 is 0.9V−(−0.5V) or 1.4V, which is not acceptable for the core transistor P13.

Various embodiments of the disclosure are advantageous over some previous approaches in which the gate of an NMOS transistor corresponding to NMOS transistor N36 is at voltage VSS. As a result, the voltage VGS drop across the gate and the source of the NMOS transistor is VSS−VBB or about 0.5 V. The NMOS transistor is not completely off, which asserts some leakage current. As a result, it is harder for the word line to be pulled up. In other words, the rise time of the signal on the word line is delayed, which delays the access time of the memory cell corresponding to word line WL. To compensate for the delay, the PMOS transistor is selected to be significantly bigger than it is required with a fully closed NMOS transistor. As a result, the area of the word line driver in the previous approaches is larger.

Table Illustrating Signal Relationships

Figure 3:
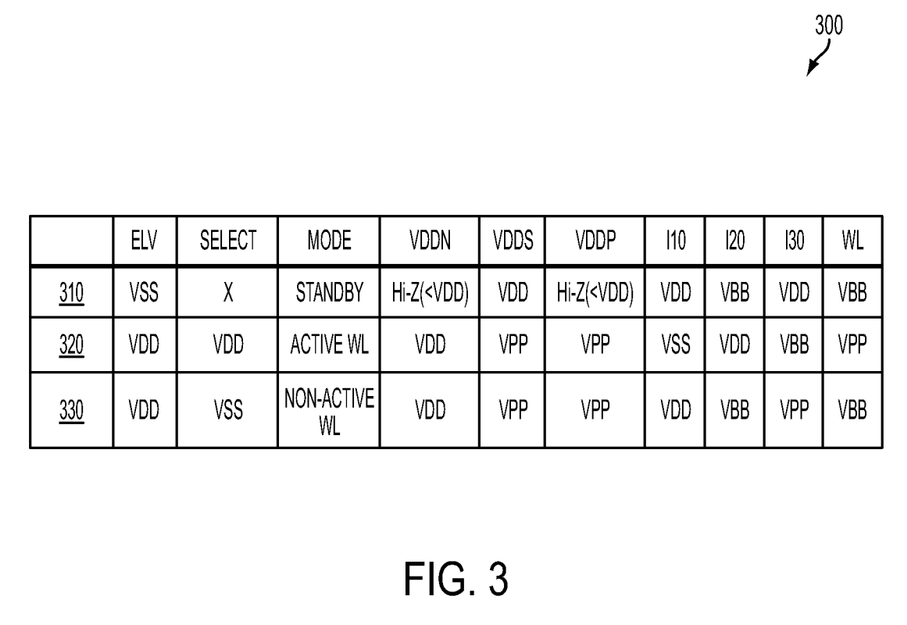
FIG. 3 is a graph of a table illustrating a relationship of various signals, in accordance with some embodiments.

FIG. 3 is a graph of a table 300 illustrating the relationship of various signals of circuit 100, in accordance with some embodiments.

With reference to row 310, when signal ELV is at voltage VSS, circuit 100 is in the standby mode regardless of the logical value of signal SELECT, which is indicated by an X. Nodes VDDN and VDDP are at a high impedance state having a voltage value less than operational voltage VDD due to the current leakage. The high impedance state is represented by "Hi-Z" in table 300. Node VDDS is at voltage VDD. Nodes I10, I20, and I30 are at voltages VDD, VBB, and VDD, respectively. Word line WL is at voltage VBB.

With reference to row 320, when signal ELV is at voltage VDD, and signal SELECT is also at voltage VDD, word line WL is active. Supply voltage nodes VDDN, VDDS, and VDDP are at voltages VDD, VPP, and VPP, respectively. Nodes I10, I20, and I30 are at voltages VSS, VDD, and VBB, respectively. Word line WL is at voltage VPP.

With reference to row 330, when signal ELV is at voltage VDD, but signal SELECT is at voltage VSS, word line WL is non-active (i.e., deactivated). Supply voltage nodes VDDN, VDDS, and VDDP are at voltages VDD, VPP, and VPP, respectively. Nodes, I10, I20, and I30 are at voltages VDD, VBB, and VPP, respectively. Word line WL is at voltage VBB.

Method Illustrating an Operation of Circuit 100

Figure 4:
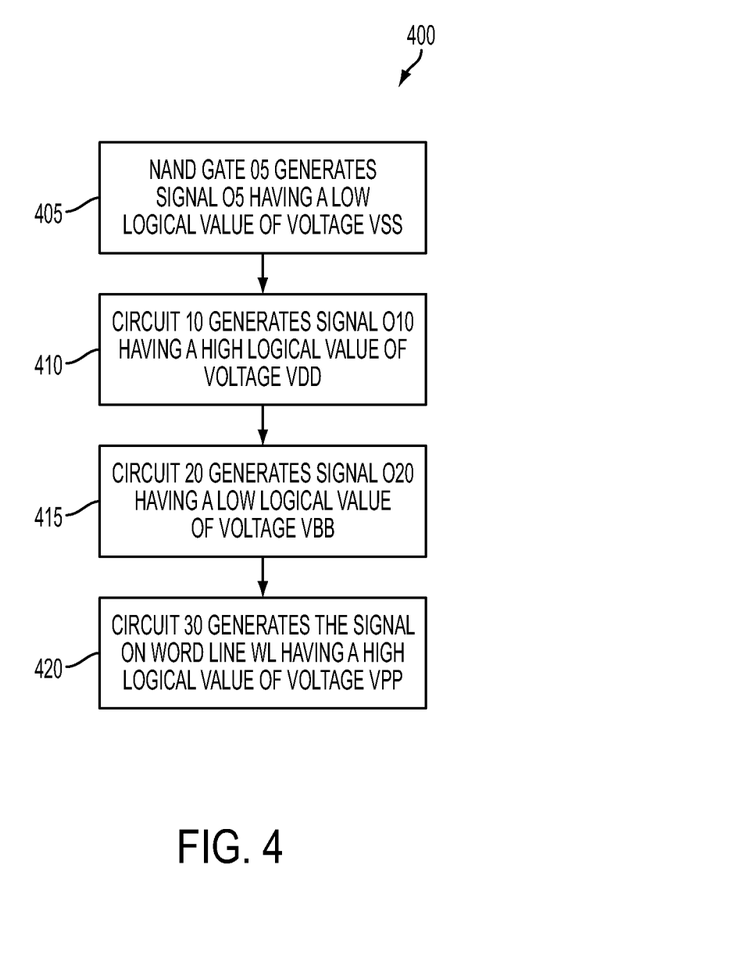
FIG. 4 is a flow chart of a method illustrating an operation of the word line driver circuit in FIG. 1, in accordance with some embodiments.

FIG. 4 is a flowchart of a method 400 illustrating an operation of circuit 100, in accordance with some embodiments. In this illustration, node I10 is at a low logical value of voltage VSS, and is converted to a high logical value of voltage VPP at word line WL. In other words, word line WL is activated and has a voltage value of voltage VPP.

In operation 405, signals SELECT and ELV are both applied with a high logical value at voltage VDD. As a result, NAND gate 5 generates signal O5 and thus signal I10 that has a low logical value at voltage VSS.

In operation 410, circuit 10 inverts the low logical value of signal I10 at voltage VSS to generate a high logical value at voltage VDD at node O10, which is coupled to node I20.

In operation 415, circuit 20 inverts the high logical value at voltage VDD of node I20 to generate a low logical value at voltage VBB of node O20, which is coupled to node I30.

In operation 420, circuit 30 inverts the low logical value at voltage VBB of node I30 to generate a high logical value at voltage VPP of word line WL.

Memory Circuit Using a Word Line

Figure 5:
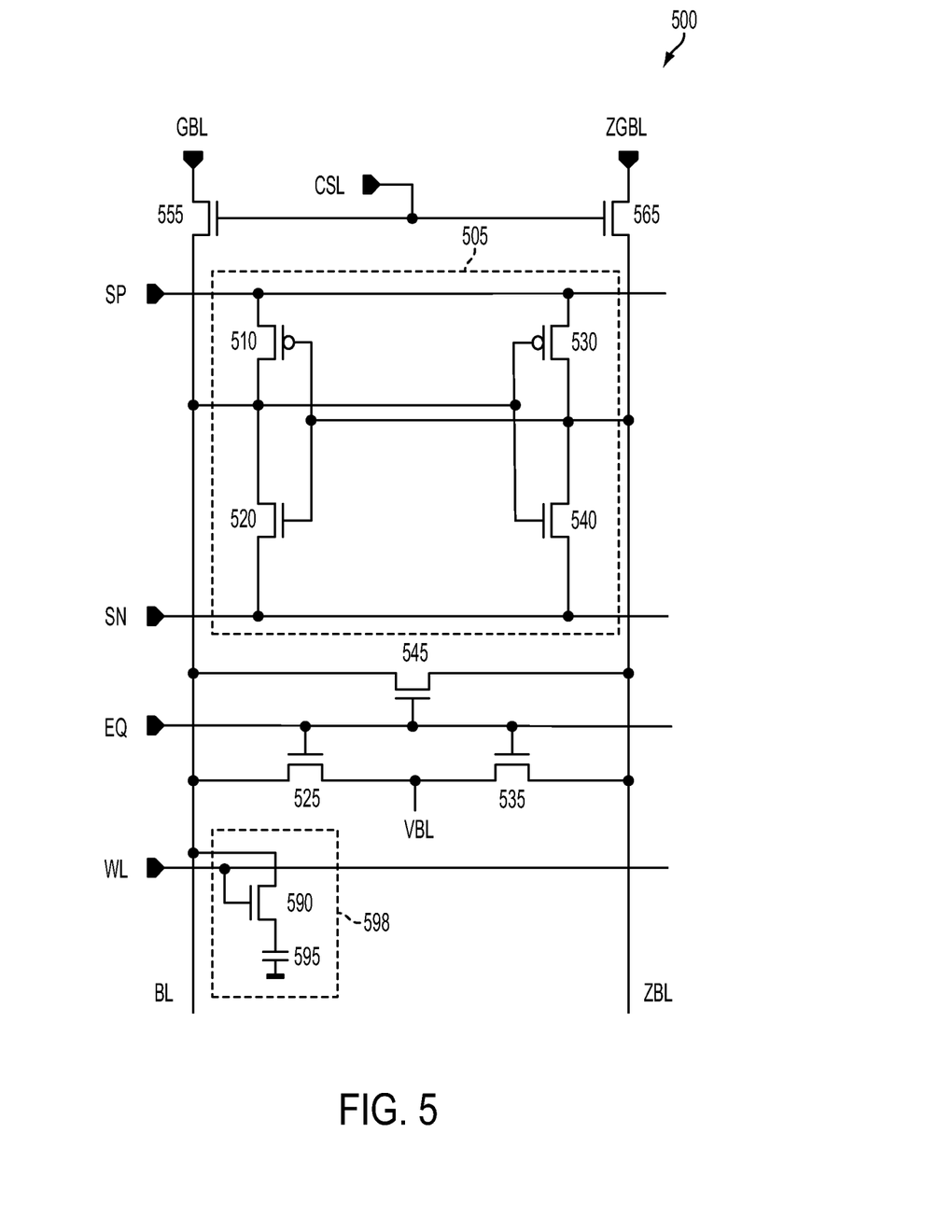
FIG. 5 is a diagram of a memory circuit using a word line, in accordance with some embodiments.

FIG. 5 is a diagram of a memory circuit 500, in accordance with some embodiments. In this illustration, word line WL in circuit 500 is generated using word line driver circuit 100 in FIG. 1. Circuit 500 is used for illustration. Other circuits using word line WL are within the scope of various other embodiments. In some embodiments, pass gate transistor 590 has a thick gate oxide and an operational voltage of about 2V, which is similar to that of transistors P12, N16, P22, N26, P32, and N36 in FIG. 1. In contrast, transistors 555, 565, 510, 520, 530, 540, 545, 535, 525 each have a thin gate oxide and an operational voltage of about 1V, which is similar to that of transistors P13 and P14 in FIG. 2.

Column select signal CSL and transistors 555 and 565 enable the data transfer between the pair of local bit lines BL and ZBL and the pair of global bit lines GBL and ZGBL, respectively.

Signal EQ and transistors 525, 535, and 545 are used to pre-charge and equalize bit lines BL and ZBL. When signal EQ is applied with a high logical value, transistors 525, 535, and 545 are turned on, enabling bit lines BL and ZBL to be at the same voltage level VBL at the drains of transistors 525 and 535. Stated differently, bit lines BL and ZBL are pre-charged and equalized to voltage VBL.

Bit cell 598 includes pass gate transistor 590 and memory cell 595. Pass gate transistor 590 allows access between local sense amplifier 505 and memory cell 595 through the pair of bit lines BL and ZBL. In some embodiments, bit lines BL and ZBL are connected to an equal number of bit cells 598, but only one bit cell 598 is shown for illustration. In some embodiments, memory cell 595 is a capacitor storing a charge. When memory cell 595 is electrically connected to a bit line BL as shown in FIG. 5, memory cell 595 shares the same charge with bit line BL. Depending on the charge indicating the logic value of memory cell 595, bit line BL is pulled toward ground level or voltage VSS or toward operational voltage VDD. For example, if memory cell 595 stores a low logical value, bit line BL is pulled toward ground. Conversely, if memory cell 595 stores a high logical value, bit line BL is pulled toward operational voltage VDD. The voltage difference between bit line BL and bit line ZBL is commonly called a bit line split or a data split, which then starts to develop.

Bit lines BL and ZBL serve as both data input and output (TO) for local sense amplifier 505. In some embodiments, in a write cycle, applying a logic value to a first bit line, and the opposite logic value to the other bit line, enables writing the logic level at the first bit line to memory cell 595. In a read cycle, sensing or reading the logic values at bit lines BL and ZBL reveals the data stored in memory cell 595. For example, once the bit line split is sufficiently large, sense amplifier 505 amplifies the bit line split, providing a full swing signal on bit lines BL and ZBL that represents the data to be read from memory cell 595. For example, if memory cell 595 stores a high logical value, then sensing bit line BL reveals a high logical value. Conversely, if memory cell 595 stores a low logical value then sensing bit line BL reveals a low logical value.

Word line WL is used to turn on or off memory pass gate transistor 590 to allow access to memory cell 595 through transistor 590. In the example of FIG. 5, bit cell 598 is electrically coupled to bit line BL for illustration. Depending on implementations in a memory array in some embodiments, some bit cells 598 are connected to bit line BL while some other bit cells 598 are connected to bit line ZBL. When word line WL at the gate of transistor 590 is applied with a low logical value, transistor 590 is turned off and the corresponding memory cell 595 is therefore electrically disconnected from bit line BL or from sense amplifier 505. When word line WL is applied with a high logical value, however, transistor 590 is turned on and the corresponding memory cell 595 is electrically connected to bit line BL.

Signals SP and SN are used to turn on or off sense amplifier 505. Signal SP is referred to as the positive supply voltage while signal SN is referred to as the negative supply voltage. However, in some embodiments, signal SN has a positive voltage. In general, when signals SP and SN are at a same level, which is close to voltage VBL, sense amplifier 505 is off. But when signal SP is at operational voltage VDD and signal SN is at ground level or voltage VSS, sense amplifier 505 is on.

Local sense amplifier 505 includes transistors 510, 520, 530, and 540. The pair of PMOS transistors 510 and 530, and the pair of NMOS transistors 520 and 540 form the sensing pairs for sense amplifier 505. When a bit line split of bit lines BL and ZBL is sufficiently developed, sense amplifier 505 is turned on to sense or amplify the bit line split and generate a full swing signal on local bit lines BL and ZBL that represent the data read from memory cell 595. Sense amplifier 505 also restores the data to memory cell 595, and sends the data to the corresponding global bit lines GBL and ZGBL.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration. Embodiments of the disclosure are not limited to a particular type. Selecting different dopant types for a particular transistor is within the scope of various embodiments. The low or high logical value of various signals used in the above description is also for illustration. Various embodiments are not limited to a particular level when a signal is activated and/or deactivated. Selecting different levels is within the scope of various embodiments.

In some embodiments, a word line driver circuit comprises a first circuit, a second circuit and a third circuit. The first circuit is configured to receive a first input signal and to generate a first output signal. The first input signal swings between a high voltage value and a low voltage value. The first output signal swings between a high voltage value and a low voltage value. The second circuit is coupled to the first circuit and configured to receive the first output signal and to generate a second output signal. The second output signal swings between a high voltage value and a low voltage value. The third circuit is coupled to the second circuit and configured to receive the second output signal and generate a third output signal. The third output signal swings between a high voltage value and a low voltage value. The high voltage value of the first input signal and of the first output signal are equal, and are less than the high voltage value of the second output signal. The low voltage value of the first input signal is higher than the low voltage value of the first output signal. The high voltage values of the second output signal and of the third output signal are equal. The low voltage values of the first output signal, the second output signal, and the third output signal are equal.

In some embodiments, a word line driver circuit comprises a first inverter, a second inverter, and a third inverter. The first inverter has a first input and a first output. The second inverter has a second input and a second output. The second input is coupled to the first output. The third inverter has a third input and a third output. The third input is coupled to the second output. The third output is configured to provide a signal for a word line of a memory cell. The first inverter includes a P-side configured to receive a first P-side voltage value and having a first P-side driving capability, and an N-side configured to receive a first N-side voltage value and having a first N-side driving capability weaker than the first P-side driving capability. The second inverter includes a P-side configured to receive a second P-side voltage value and having a second P-side driving capability, and an N-side configured to receive a second N-side voltage value and having a second N-side driving capability stronger than the second P-side driving capability. The third inverter includes a P-side configured to receive a third voltage P-side voltage value and an N-side configured to receive a third N-side voltage value.

In some embodiments, a word line driver circuit comprises a first circuit, a second circuit coupled to the first circuit, and a third circuit coupled to the second circuit and having a PMOS transistor coupled in series with an NMOS transistor. The first circuit is configured to convert a low logical value of a first input to a high logical value of a first output of the first circuit. The second circuit is configured to convert the high logical value of the first output to a low logical value of a second output of the second circuit. The low logical value of the second output equals a voltage value at a source of the NMOS transistor. The output node is configured to provide a signal for a word line of a memory cell.

The above illustration includes exemplary steps, but the steps are not necessarily performed in the order shown. Steps may be added, replaced, changed order, and/or eliminated as appropriate, in accordance with the spirit and scope of disclosed embodiments.

What is claimed is:

1. A word line driver circuit comprising:
a first circuit configured to receive a first input signal and to generate a first output signal, the first input signal swinging between a high voltage value and a low voltage value of the first input signal, the first output signal swinging between a high voltage value and a low voltage value of the first output signal;
a second circuit coupled to the first circuit and configured to receive the first output signal at an input of the second circuit and to generate a second output signal at an output of the second circuit, the second output signal swinging between a high voltage value and a low voltage value of the second output signal, and the input and the output of the second circuit being configured to be free from having a positive feedback path; and
a third circuit coupled to the second circuit and configured to receive the second output signal and generate a third output signal, the third output signal swinging between a high voltage value and a low voltage value of the third output signal,
wherein
the high voltage value of the first input signal and of the first output signal are equal, and are less than the high voltage value of the second output signal;
the low voltage value of the first input signal is higher than the low voltage value of the first output signal;
the high voltage values of the second output signal and of the third output signal are equal; and
the low voltage values of the first output signal, the second output signal, and the third output signal are equal.

2. The word line driver circuit of claim 1, wherein the word line driver circuit is configured to meet at least one of the following conditions:
the first circuit includes a first inverter;
the second circuit includes a second inverter; or
the third circuit includes a third inverter.

3. The word line driver circuit of claim 2, wherein the word line driver circuit is configured to meet at least one of the following conditions:
a P-side of the first inverter is stronger than an N-side of the first inverter; or
an N-side of the second inverter is stronger than a P-side of the second inverter.

4. The word line driver circuit of claim 2, wherein the word line driver circuit is configured to meet at least one of the following conditions:
P-side and N-side transistors of the first inverter include a transistor having an operational voltage higher than an operational voltage of core transistors;
P-side and N-side transistors of the second inverter include a transistor having an operational voltage higher than the operational voltage of the core transistors; or
P-side and N-side transistors of the third inverter include a transistor having an operational voltage higher than the operational voltage of the core transistors.

5. The word line driver circuit of claim 1, wherein the word line driver circuit is configured to meet at least one of the following conditions:
the first circuit includes at least two PMOS transistors that are coupled in series and that have an operational voltage corresponding to an operational voltage of core transistors, and the first circuit further includes an NMOS transistor coupled to the least two PMOS transistors and having an operational voltage higher than the operational voltage of the core transistors;
the second circuit includes a PMOS transistor having an operational voltage higher than the operational voltage of the core transistors, and coupled in series with an NMOS transistor having an operational voltage higher than the operational voltage of the core transistors; or
the third circuit includes a PMOS transistor having an operational voltage higher than the operational voltage of the core transistors, and coupled in series with an NMOS transistor having an operational voltage higher than the operational voltage of the core transistors.

6. The word line driver circuit of claim 1, wherein
a P-side current of a P-side of the first circuit and an N-side current of an N-side of the first circuit are selected to maximize an output level of the first circuit; or
a P-side current of a P-side of the second circuit and an N-side current of an N-side of the second circuit are selected based on a threshold voltage of an N-side transistor in the third circuit.

7. A word line driver circuit comprising:
a first inverter having a first input and a first output, the first input being configured to receive a control signal, and the first inverter being free from receiving another control signal;
a second inverter having a second input and a second output, the second input coupled to the first output; and
a third inverter having a third input and a third output, the third input coupled to the second output,
wherein
the third output is configured to provide a signal for a word line of a memory cell;
the first inverter includes
a P-side configured to receive a first P-side voltage value and having a first P-side driving capability; and
an N-side configured to receive a first N-side voltage value and having a first N-side driving capability weaker than the first P-side driving capability;
the second inverter includes
a P-side configured to receive a second P-side voltage value and having a second P-side driving capability; and
an N-side configured to receive a second N-side voltage value and having a second N-side driving capability stronger than the second P-side driving capability; and
the third inverter includes
a P-side configured to receive a third P-side voltage value; and
an N-side configured to receive a third N-side voltage value.

8. The word line driver circuit of claim 7, wherein the word line driver circuit is configured such that:
the first output swings between the first P-side voltage value and the first N-side voltage value;
the second output swings between the second P-side voltage value and the second N-side voltage value;
the third output swings between the third P-side voltage value and the third N-side voltage value;
the first N-side voltage value, the second N-side voltage value, and the third N-side voltage value are equal;
the first P-side voltage value is less than the second P-side voltage value; and
the second P-side voltage value equals the third P-side voltage value.

9. The word line driver circuit of claim 7, wherein
the word line driver circuit is configured to receive the control signal having a first input high voltage value and a first input low voltage value;
the first input high voltage value equals the first P-side voltage value;
the first P-side voltage value is less than the second P-side voltage value;
the second P-side voltage value equals the third P-side voltage value;
the first input low voltage value is higher than the first N-side voltage value; and
the first N-side voltage value, the second N-side voltage value, and the third N-side voltage value are equal.

10. The word line driver circuit of claim 7, wherein
each of the P-side of the first inverter, the second inverter, and the third inverter includes a PMOS transistor having an operational voltage higher than an operational voltage of core transistors; and
each of the N-side of the first inverter, the second inverter, and the third inverter includes an NMOS transistor having an operational voltage higher than the operational voltage of the core transistors.

11. The word line driver circuit of claim 7, wherein
the P-side of the first inverter includes a first thin oxide PMOS transistor coupled in series with a second PMOS transistor having an operational voltage being the same as an operational voltage of core transistors;
each of the P-side of the second inverter and the third inverter include a PMOS transistor having an operational voltage higher than the operational voltage of the core transistors; and
each of the N-side of the first inverter, the second inverter, and the third inverter includes an NMOS transistor having an operational voltage higher than the operational voltage of the core transistors.

12. The word line driver circuit of claim 7, wherein
a P-side current of the P-side of the first inverter and an N-side current of the N-side of the first inverter are selected to maximize an output level of the first circuit; and
a P-side current of the P-side of the second inverter and an N-side current of the N-side of the second inverter are selected based on a threshold voltage of an N-side transistor in the third inverter.

13. A word line driver circuit comprising:
a first circuit;
a second circuit coupled to the first circuit; and
a third circuit coupled to the second circuit and having a PMOS transistor coupled in series with an NMOS transistor at an output node;
wherein
the first circuit is configured to convert a low logical value of a first input to a high logical value of a first output of the first circuit;
the second circuit is configured to convert the high logical value of the first output to a low logical value of a second output of the second circuit, and the second input and the second output are configured to be free from having a positive feedback path;
the low logical value of the second output equals a voltage value at a source of the NMOS transistor; and
the output node is configured to provide a signal for a word line of a memory cell.

14. The word line driver circuit of claim 13, wherein
the first circuit includes an inverter having a P-side current of a P-side of the first circuit stronger than an N-side current of an N-side of the first circuit; and
the second circuit includes an inverter having an N current of an N-side of the second circuit stronger than a P-side current of a P-side of the second circuit.

15. The word line driver circuit of claim 14, wherein
the P-side current of the P-side of the first circuit and the N-side current of the N-side of the first circuit are selected to maximize an output level of the first circuit; and
the P-side current of the P-side of the second circuit and the N-side current of the N-side of the second circuit are selected based on a threshold voltage of an N-side transistor in the third circuit.

16. The word line driver circuit of claim 13, wherein
the first circuit includes an inverter having a first first-circuit PMOS transistor coupled in series with a second first-circuit PMOS transistor, which is coupled in series with a first first-circuit NMOS transistor;
the first and the second first-circuit PMOS transistors have an operational voltage being the same as an operational voltage of core transistors; and the first first-circuit NMOS transistor has an operational voltage higher than the operational voltage of the core transistors.

17. The word line driver circuit of claim 16, wherein the word line of the memory cell is electrically coupled with the memory cell through a PMOS pass gate transistor having an operational voltage higher than the operational voltage of the core transistors.

18. The word line driver circuit of claim 13, wherein
the first circuit includes a first inverter having a first PMOS transistor coupled in series with a first NMOS transistor having an operational voltage higher than the operational voltage of the core transistors;
the second circuit includes a second inverter having a second PMOS transistor having an operational voltage higher than the operational voltage of the core transistors, and coupled in series with a second NMOS transistor having an operational voltage higher than the operational voltage of the core transistors; and
the third circuit includes a third inverter having a third PMOS transistor having an operational voltage higher than the operational voltage of the core transistors, and coupled in series with a third NMOS transistor having an operational voltage higher than the operational voltage of the core transistors.

19. The word line driver circuit of claim 13, wherein
the first circuit includes a first PMOS transistor coupled in series with a first NMOS transistor, the first PMOS transistor configured to receive a first P-side voltage value, the first NMOS transistor configured to receive a first N-side voltage value;
the second circuit includes a second PMOS transistor coupled in series with a second NMOS transistor, the second PMOS transistor configured to receive a second P-side voltage value, the second NMOS transistor configured to receive a second N-side voltage value;
the PMOS transistor of the third circuit is configured to receive a third P-side voltage value, the NMOS transistor of the third circuit is configured to receive a third N-side voltage value;
the first P-side voltage value is less than the second P-side voltage value;
the second P-side voltage value equal the third P-side voltage value; and
the first N-side voltage value, the second N-side voltage value, and the third N-side voltage value are equal.

20. The circuit of claim 19, wherein
the low logical value of the first input is higher than the first N-side voltage value; and
the high logical value of the first input is lower than the second P-side voltage value.

* * * * *